United States Patent
Okura et al.

(10) Patent No.: US 6,949,752 B2
(45) Date of Patent: Sep. 27, 2005

(54) ELECTRON BEAM APPARATUS AND HIGH-VOLTAGE DISCHARGE PREVENTION METHOD

(75) Inventors: Akimitsu Okura, Hitachinaka (JP); Masashi Kimura, Tokai-mura (JP); Kenichi Hirane, Hitachi (JP); Yoshihiko Nakayama, Hitachinaka (JP)

(73) Assignees: Hitachi High-Technologies Corporation, Tokyo (JP); Hitachi Science Systems, Ltd., Ibaraki (JP)

( * ) Notice: Subject to any disclaimer, the term of this patent is extended or adjusted under 35 U.S.C. 154(b) by 0 days.

(21) Appl. No.: 10/295,951

(22) Filed: Nov. 18, 2002

(65) Prior Publication Data

US 2003/0155525 A1 Aug. 21, 2003

(30) Foreign Application Priority Data

Feb. 15, 2002 (JP) ........................ 2002-038525

(51) Int. Cl.[7] .............................................. G09G 1/04
(52) U.S. Cl. .............................. 250/441.11; 250/443.1; 250/307
(58) Field of Search ..................... 250/441.11, 443.1, 250/307

(56) References Cited

U.S. PATENT DOCUMENTS

| | | | | |
|---|---|---|---|---|
| 4,335,297 A | * | 6/1982 | Little ..................... | 219/121.24 |
| 4,427,886 A | | 1/1984 | Martin et al. | |
| 5,012,194 A | * | 4/1991 | Licter et al. ................. | 324/405 |
| 5,138,232 A | | 8/1992 | Schleiff et al. | |
| 5,682,412 A | * | 10/1997 | Skillicorn et al. .......... | 378/98.6 |
| 5,834,781 A | * | 11/1998 | Fukuhara ................. | 250/423 F |
| 6,034,479 A | * | 3/2000 | Xia .......................... | 315/169.1 |
| 6,456,019 B1 | * | 9/2002 | Gordon et al. .............. | 315/383 |
| 6,556,654 B1 | * | 4/2003 | Hansen et al. .............. | 378/101 |
| 2002/0036264 A1 | * | 3/2002 | Nakasuji et al. ............ | 250/306 |

FOREIGN PATENT DOCUMENTS

| | | |
|---|---|---|
| JP | 1-120745 | 5/1989 |
| WO | WO00/68970 | 11/2000 |

OTHER PUBLICATIONS

Saez P et al.: "High Voltage Processing of the SLC Polarized Electron Gun," Particle Accelerator Conference, 1993, Proceedings of the 1993 Washington, D.C. USA May 17–20, 1993, New York, NY.

* cited by examiner

*Primary Examiner*—Nikita Wells
*Assistant Examiner*—Anthony Quash
(74) *Attorney, Agent, or Firm*—Dickstein Shapiro Morin & Oshinsky LLP

(57) ABSTRACT

Disclosed is an electron beam apparatus and method which can retain the state that minimizes the amount of water content contained at a gap between a high-voltage cable and a high-voltage introduction insulator to thereby prevent creation of high-voltage discharge and current leakage. The apparatus comprises a means for applying a high voltage to an acceleration electrode while eliminating electron release from an electron source and for detecting a change in an emission current corresponding to a change in an acceleration voltage at this time. In addition, the apparatus comprises a means for issuing a cautionary notice or warning when the change of this emission current exceeds a prespecified value. Further, the apparatus comprises a means for letting a dry gas flow in a gap portion between the electron gun's high-voltage cable and the high-voltage introduction insulator to thereby dehumidify said gap portion. With such an arrangement, it is possible to prevent high-voltage discharge due to an increase in water content of the gap portion and also instability of an electron beam due to a leakage current.

14 Claims, 6 Drawing Sheets

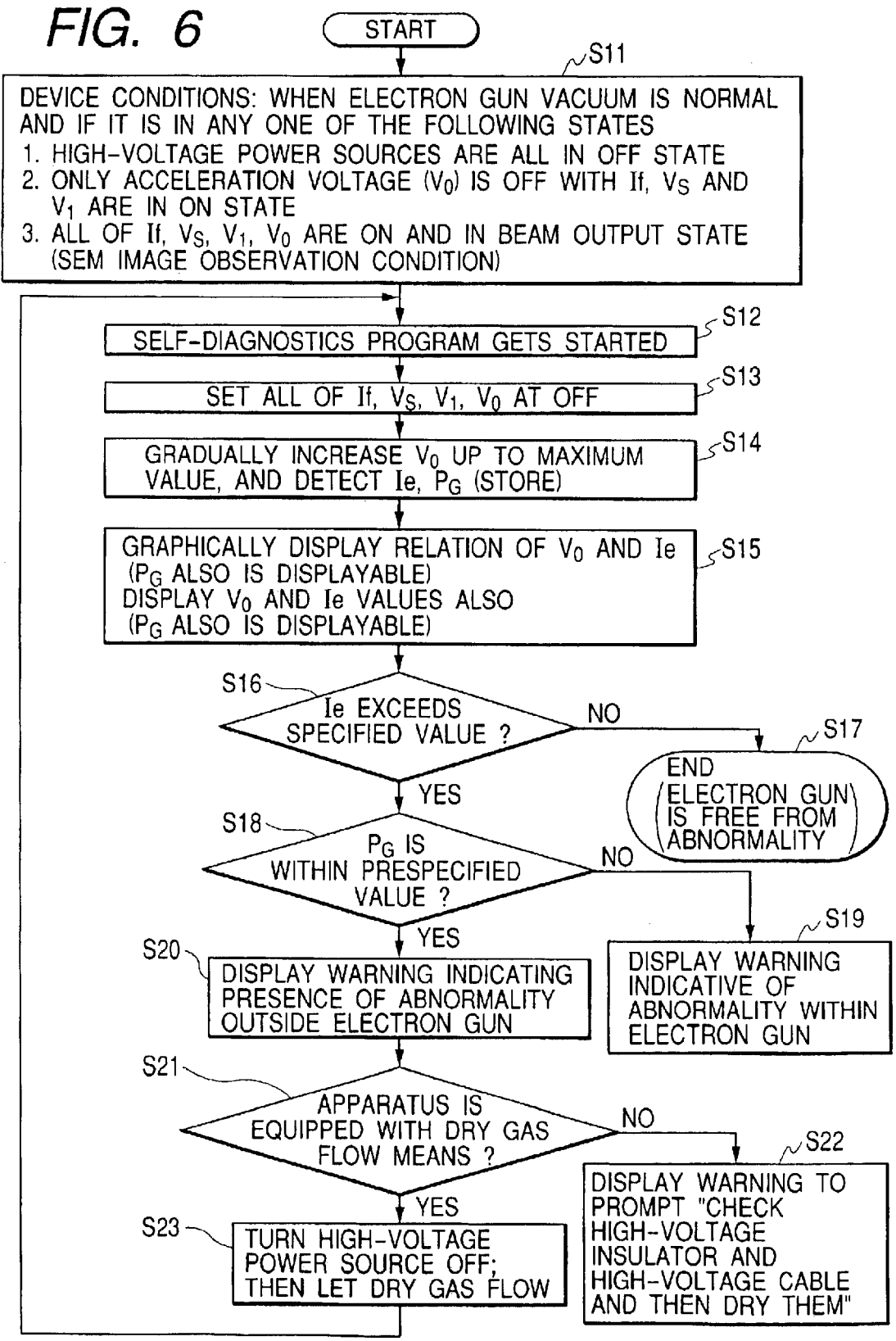

ELECTRON BEAM APPARATUS AND HIGH-VOLTAGE DISCHARGE PREVENTION METHOD

BACKGROUND OF THE INVENTION

1. Field of the Invention

The present invention relates generally to electron beam apparatus equipped with high-brightness electron sources and, more particularly, to electron beam apparatus adaptable for use with equipment with built-in electron guns utilizing Schottky emission effects and also a high-voltage discharge prevention method thereof.

2. Description of the Related Art

While electron beam apparatus requires the use of an electron gun for taking an electron beam out of it, a high-voltage cable which is inserted from ambient air side into a high-voltage introduction insulator unit of the electron gun for supplying a filament heat-up current and/or a high voltage to an electron source is typically attached. However, if water content or moisture resides in a gas (typically air) which is present on the surface of this high-voltage introduction insulator and the surface of a high-voltage cable and also in a gap between the both, then discharge can take place in high-voltage application events resulting in destruction of the electron source. To avoid this, in the prior art, a dryer is used to sufficiently dry the surfaces of the high-voltage introduction insulator and high-voltage cable to thereby retain enhanced air-tightness between them for prevention of entry of wet air from the outside into the gap therebetween.

With the electron gun of the above-stated prior art electron beam apparatus, it is difficult to maintain the required air-tightness for an increased length of time period at the junction portion of an electrical conductive portion and a dielectric portion (mold material) of the high-voltage cable even when the electron gun is designed to prevent entry of any moisture from the outside upon insertion of the high-voltage cable into the high-voltage introduction insulator side under ambient air pressures. Due to this, there has been a problem which follows: with elapse of time, moisture-containing air enters into the gap between the high-voltage introduction insulator and the high-voltage cable resulting in an increase in amount of water content, which sometimes leads to ionization during high-voltage application causing discharge or generation of a leakage current, resulting in damages of the electron source and/or decreases in stability of a beam current.

SUMMARY OF THE INVENTION

An object of the present invention is to solve the above-described problem faced with the prior art to thereby provide electron beam apparatus and method capable of retaining in the state that the amount of water content or moisture contained in the gap between the high-voltage cable and high-voltage introduction insulator is minimized to thereby preclude unwanted creation of any high-voltage discharge and/or leakage current.

To attain the foregoing object, the present invention provides an electron beam apparatus which has an electron gun for take-out of an electron beam, characterized by comprising means for applying a high voltage to an acceleration electrode while eliminating emission of electrons from an electron source and for detecting a change in emission current corresponding to a change of an acceleration voltage at this time. It also comprises means for issuing a caution or warning when the change of said emission current exceeds a prespecified value. It further comprises means for causing a dry gas to flow in a gap portion between a high-voltage cable and a high-voltage introduction insulator of the electron gun to thereby dehumidify said gap portion. With such arrangements, it is possible to prevent high-voltage discharge due to an increase in water content at the gap portion and also to preclude electron-beam instability due to current leakage.

BRIEF DESCRIPTION OF THE DRAWINGS

FIG. 6 is a flow diagram showing one embodiment procedure of a self-diagnostics program in the present invention.

DESCRIPTION OF THE PREFERRED EMBODIMENTS

A preferred embodiment of the present invention will now be explained in detail with reference to the accompanying drawings below.

Figure 1:
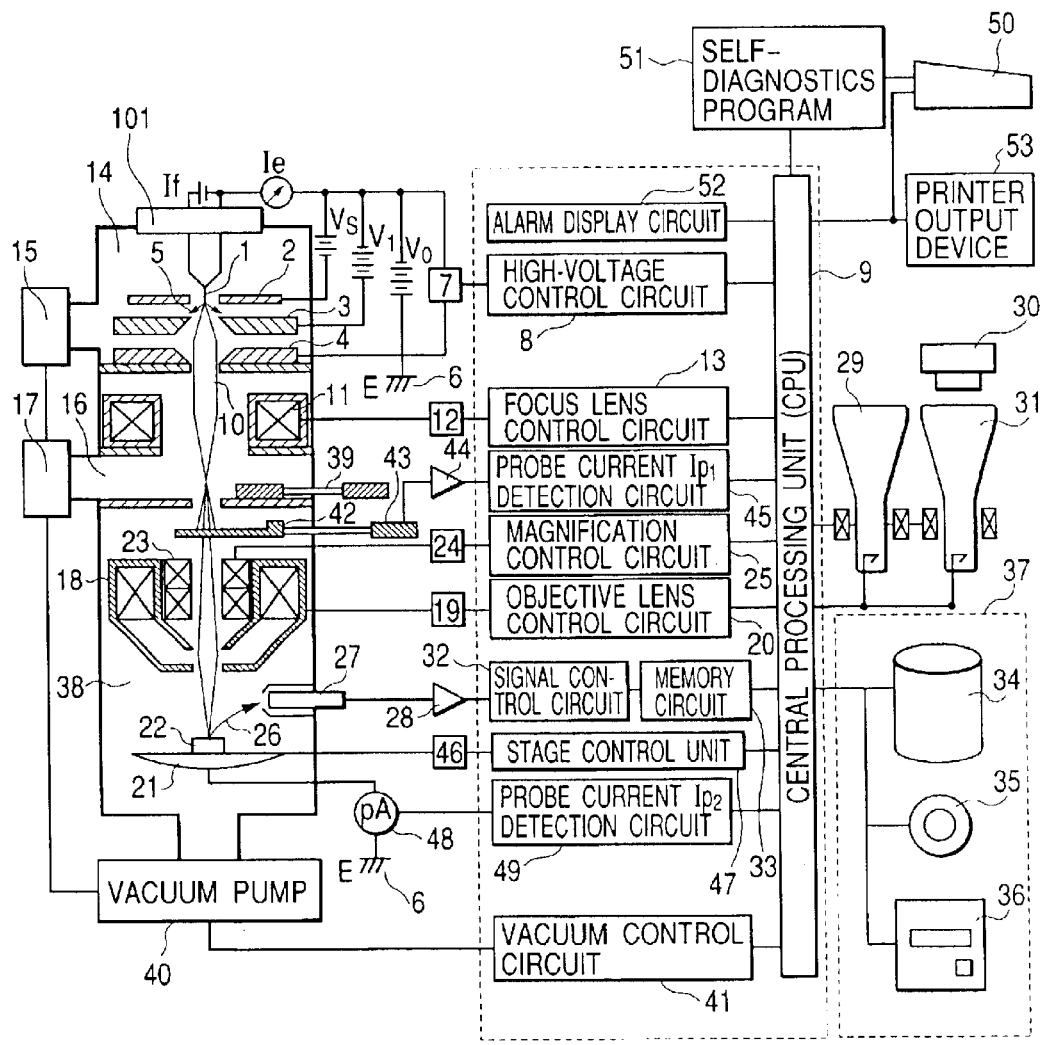
FIG. 1 is a schematic arrangement diagram showing one embodiment of the electron beam apparatus in accordance with the present invention.

FIG. 1 is a schematic arrangement diagram showing one embodiment of the electron beam apparatus in accordance with the instant invention, which is an embodiment concerning a scanning electron microscope (abbreviated as "SEM" hereinafter) with a built-in electron gun of the Schottky emission type.

The Schottky emission type electron gun consists essentially of a needle-shaped or needle shaped cathode (SE-tip) 1, a suppressor electrode 2, a first anode 3, a second anode 4 and others. A extracting voltage $V_1$ with its potential of approximately 1 to 3 kV is applied between the needle shaped cathode 1 and the first anode 3. This electric field is used to cause electrons 5 to release out of the needle shaped cathode which is configured from a ZrO/W tip. A flow of these electrons will be detected as an emission current Ie. Part of these electrons passes through a central hole of the first anode and is then accelerated by an acceleration voltage $V_o$ with a potential of about 0.5 kV to several tens of kV, which is applied between the needle shaped cathode 1 and second anode 4.

Note here that the second anode 4 is set at the same potential level as Earth (E) 6. Optionally, although not specifically illustrated in the drawing, depending upon the electron gun used, there is a case where a third anode ($V_2$) is provided between the first anode 3 and the second anode 4 for adjusting the focusing function/operation of an electrostatic lens. The suppressor electrode 2 is the electrode that is for suppressing unnecessary thermal-electrons which are released by letting a heat-up current If flow in a filament that supports the needle shaped cathode 1. Applied thereto is a negative voltage Vs with a potential of about 0.1 to 1 kV. These If, Ie, Vs, $V_1$ and $V_o$ are built in a high-voltage power supply 7 and connected to a high-voltage control circuit 8 and a central control device (CPU) 9 which controls an entire system of SEM.

Electrons which are accelerated by the acceleration voltage $V_o$ pass through the center hole of the second anode 4 to become an electron beam 10. And an arrangement for adjusting the focal point to be a desired position is made up of an electromagnetic lens which is provided at lower part of the second anode and is called a focusing lens (or alternatively condenser lens) 11, a focusing lens power supply 12, and a focusing lens control circuit 13. An electron gun chamber 14 is typically maintained by an ion pump 15 at a vacuum degree (pressure) of less than or equal to $10^{-7}$ Pa. In addition, an electromagnetic lens chamber 16 in which the focusing lens 11 is put is retained by another ion pump 17 at a vacuum degree (pressure) of less than or equal to $10^{-6}$ Pa. It is noted that although the ion pump of the electron gun chamber should not be limited to a single one and may consist of a plurality of ones in some cases, an explanation here is directed to an exemplary case where it consists of a single one.

An electromagnetic lens, called an objective lens 18, is further provided at the lower part of the focusing lens 11, wherein an objective lens power supply 19 and an objective lens control circuit 20 are used to focus the electron beam 10 on a sample or specimen 22 which is mounted on a specimen stage 21. While scanning this focused electron beam on a specimen surface by use of a deflection coil 23 and a scanning power supply 24 plus a magnification control circuit 25, let a signal detector 27 detect a signal such as secondary electrons 26 produced from the specimen; then, amplify it by a signal amplifier 28.

Send this signal as an image signal to a cathode ray tube (CRT) 29; then, observe it as a SEM image on the CRT.

Note that in case a need is felt to print out a scan image, a camera device 30 is used to photograph a display image of a photograph-use CRT 31; alternatively, let it be printed by an image printer, not depicted herein. Still alternatively, use a signal control circuit 32 and a memory circuit 33 to store the image. Further, store it via the central control device 9 in an external storage device 37 such as a hard disk 34, optical disc 35 or magneto-optical disc 36.

It should be noted that an air lock device 39 is provided at lower part of the focusing lens 11 for vacuum-shielding a passage between it and the sample chamber 38 and permitting operative coupling thereto, which device is opened and closed in specimen-exchange/replacement events.

The specimen chamber 38 is normally kept by a vacuum pump 40 such as a turbo molecular pump at a vacuum of the order of magnitude of $10^{-4}$ Pa. The vacuum degree of each portion including the specimen chamber 38 is controlled by a vacuum system control circuit 41. Additionally an object movable diaphragm 42 is provided above the objective lens 18 (or within an objective lens gap) for shaping the electron beam to have a decreased cross-section area and for cutting dispersed electrons. An electron flow detector 43 is for detection of the amount of an electron beam (probe current $IP_1$) radiated onto this diaphragm and a signal amplifier 44 operatively associated therewith are further provided and coupled to a probe current $IP_1$ detection circuit 45.

On the other hand, the specimen 22 is provided with a small-diameter deep hole which is equivalent to a Faraday cup, wherein the center of this deep hole is adjusted by a specimen stage drive power supply 46 and a stage control circuit 47 at the center of an optical axis to thereby enable receipt of an entire irradiation current onto the specimen. This is readily done by maximally increasing the magnification while observing the SEM image. Obviously, the specimen stage may be modified so that it is manually movable. The specimen irradiation current which was received at the hole on the specimen in this way is detectable by a probe current $IP_2$ detection circuit 49 as a probe current $IP_2$, by connecting it to a micro-current meter 48 outside of the vacuum through a specimen current introduction terminal (not shown) of the specimen stage 21. Optionally, this $IP_2$ detection may also be performed by a Faraday cup (not shown) which is separately attached to the specimen chamber.

The beam current which is taken out by the Schottky emission type electron gun has a feature that it is extremely high in brightness or luminance and stays at several % or less in variation of beam current for an increased length of time period to thereby offer enhanced stability. However, when discharge occurs between electrodes of the electron gun and/or when discharge takes place between electrical conductive portions of the high-voltage cable and the high-voltage introduction insulator and the Earth, the electron source's tip end is rapidly melt down, making it impossible to obtain any high-brightness electron beam, which would sometimes result in inability to obtain the required image resolution as SEM images. Regarding electron beam apparatus and electron-gun good/bad judgment method which are preferably used to perform evaluation of the cause of any improper electron-beam radiation such as image degradation and resolution reduction in this case, the present inventors have been filed a patent application PCT/JP99/06258. Note however that this is the one that concerns good/bad judgment of the Schottky emission type electron source.

On the other hand, it will sometimes happen that the dielectricity of surfaces of the high-voltage cable and high-voltage introduction insulator decreases resulting in an increase in leakage current upon application of a high voltage, which in turn causes the beam current to become unstable thereby causing the resolution to decrease accordingly. Although in some cases these are caused by contamination of the high-voltage cable and high-voltage introduction insulator surfaces and also by attachment of dusts and contaminant particles thereto, it is considered that the decrease in resolution is due to the fact that water content on the high-voltage cable surface or the high-voltage introduction insulator surface and in the gap between the both is ionized causing micro discharge to readily occur in cases where a temperature change of the electron gun part is repeated many times by ON-OFF of the apparatus or alternatively the creation of electron gun part discharge and/or leakage current tends to readily occur under high humidity environment. In view of the fact that once the electron source is melt down due to discharging, long time is required to perform a procedure covering from replacement of the electron source up to successful start-up of the apparatus such as ultra-high vacuum evacuation, electron gun baking, electron gun conditioning (withstanding voltage test) and beam output and the like, losses thereof are very large from view points of the labor, time and cost. Due to this, this embodiment is equipped with a means 101 for sealing and dehumidifying the electron gun side of the high-voltage cable.

Figure 2:
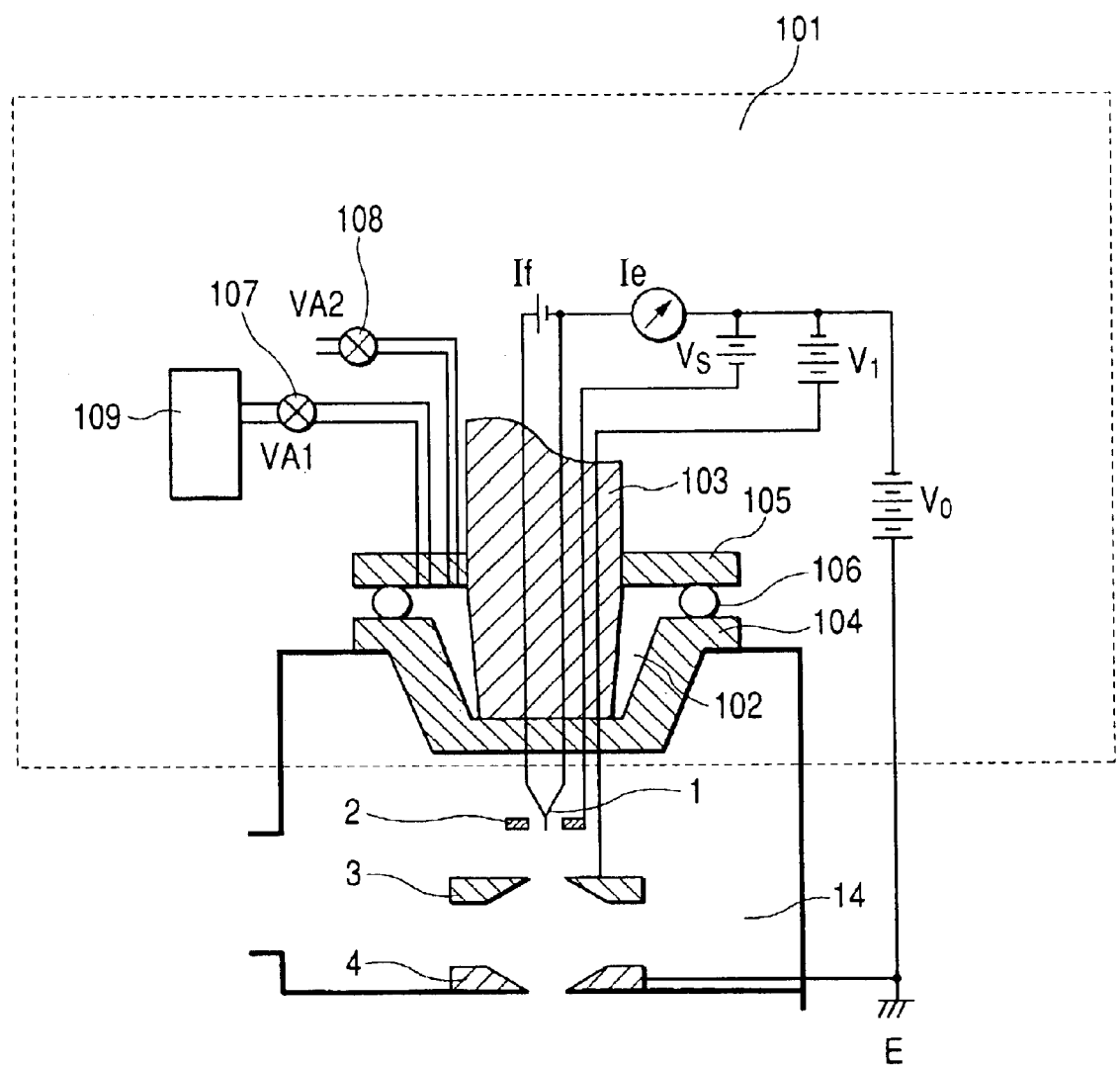
FIG. 2 is a schematic arrangement diagram for further detailed explanation of gap dehumidification means in FIG. 1.

FIG. 2 is a schematic arrangement diagram for further detailed explanation of the means 101 shown in FIG. 1, which is for sealing the electron gun side of the high-voltage cable and for dehumidifying a gap portion 102.

In FIG. 2, a high-voltage cable 103 is inserted into an ambient air side high-voltage introduction insulator 104 of the electron gun chamber and is connected to the needle shaped cathode 1 and the suppressor electrode 2 and the first anode 3, which are within the electron gun chamber. An O-ring or a rubber packing or a high dielectric seal material 106 made of polyimide resin or else is provided between a holder 105 which is attached to the outer peripheral part of this high-voltage cable 103 and the high-voltage introduction insulator 104, thereby providing a sealed space which prevents entry or invasion of any moisture from the outside. In a normal beam output state, If, Vs, $V_1$, $V_o$ turn ON, allowing a temperature of the needle shaped cathode 1 to stay at 1600K to 1800K. A contact surface of the high-voltage cable and the high-voltage introduction insulator at this time reaches 50° C. to 60° C. due to heat conduction from the filament portion of the needle shaped cathode. Thus it is considered that if water content is adsorbed at either the high-voltage cable or the high-voltage introduction insulator, then it is released to the gap portion 102 between the both and is then ionized during high voltage application, which becomes the cause of discharge and/or current leakage.

Although prior to insertion of the high-voltage cable into the high-voltage introduction insulator a drier or the like is customarily used to sufficiently dry the surfaces of the both in advance, the state after insertion is not always completely sealed with respect to the outside air and thus permits a little amount of air to income and outgo through gaps of the sealing member (O-ring or rubber packing or else) for sealing the outside air and the conductive part of high-voltage cable and others. In addition, as a heat cycle is applied due to a filament current with ON-OFF of the high voltage power supply, it happens in some cases that if water content from the outside air invades when cooled, then ionization occurs while the acceleration voltage is increasing in potential during re-startup of the high voltage power supply, which in turn triggers creation of discharge and/or current leakage. A sign of occurring this can be predicted by the following method of the present invention.

To be brief, with this embodiment, in the state that the high-voltage cable was inserted into the high-voltage introduction insulator, set If, Vs, $V_1$ to OFF (0V: note that the terms "OFF" and "0V" are used in this specification to include not only the case of strictly defined 0V but also the case of a positive or negative voltage near 0V) while letting $V_o$ alone gradually rise up in potential; then, measure an emission current Ie at that time. Its characteristics example is shown in FIG. 3.

Figure 3:
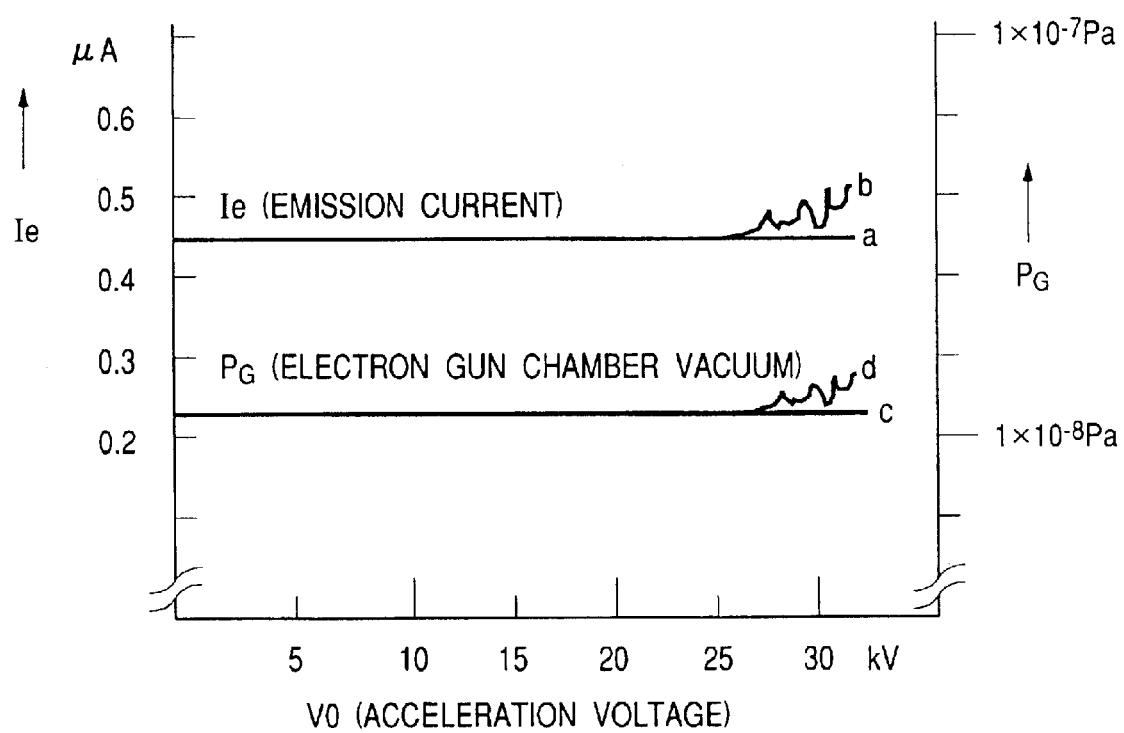
FIG. 3 is a characteristics example for explanation of the relation of an emission current and electron gun chamber vacuum degree relative to acceleration voltage.

In FIG. 3, if the surfaces of the high-voltage cable and the high-voltage introduction insulator are made dry sufficiently and if a gas at the gap portion 102 between the both also is dried sufficiently then any appreciable change hardly occurs in Ie up to a maximal acceleration voltage (e.g. 30 kV) used generally even when the acceleration voltage potentially increases as shown by "a" in the drawing. On the contrary, in case water content is attached to the surfaces of the high-voltage cable and high-voltage introduction insulator or in case contaminants which give electrical conductivity are attached thereto, a very small leakage current will become detectable when the acceleration voltage reaches for example about 25 kV as shown by "b" in the drawing (an explanation as to "c" and "d" in FIG. 3 will be given later). Continuously monitor or watching this state for about 30 minutes; then, operate a keyboard 50 shown in FIG. 1 to start a self-diagnostics program 51; next, output the Ie's change at every time point to a printer 53 through the high-voltage control circuit 8 and central control device 9 or alternatively display it on the CRT 29. Additionally let the storage device 37 store it. In case Ie exceeds a prespecified value, for example when it goes beyond 0.5 μA, give a warning by use of a buzzer via an alarm display circuit 52 and the central processing unit (CPU) 9.

Alternatively, display the warning on the CRT 29 or display the warning at the printer output device 53.

In the case of issuance of such warning, let $V_o$ be OFF (obviously, If, Vs and $V_1$ also are also OFF'ed). Thereafter, perform dehumidification by the gap dehumidifying means 101 shown in FIG. 2. An example of this procedure will be described below. In FIG. 2, open both a dry gas introduction valve (VA1) 107 and a dry gas exhaust valve (VA2) 108 to thereby introduce a dry gas from a dry gas device 109 for replacement of the presently existing gas in the gap portion 102. After having done gas replacement for a predefined length of time period, close said valves VA1, VA2. Dry air or dry nitrogen gas is appropriate for use as the dry gas. Note however that the dry nitrogen gas requires significantly careful attention to the lack of oxygen.

Figure 4:
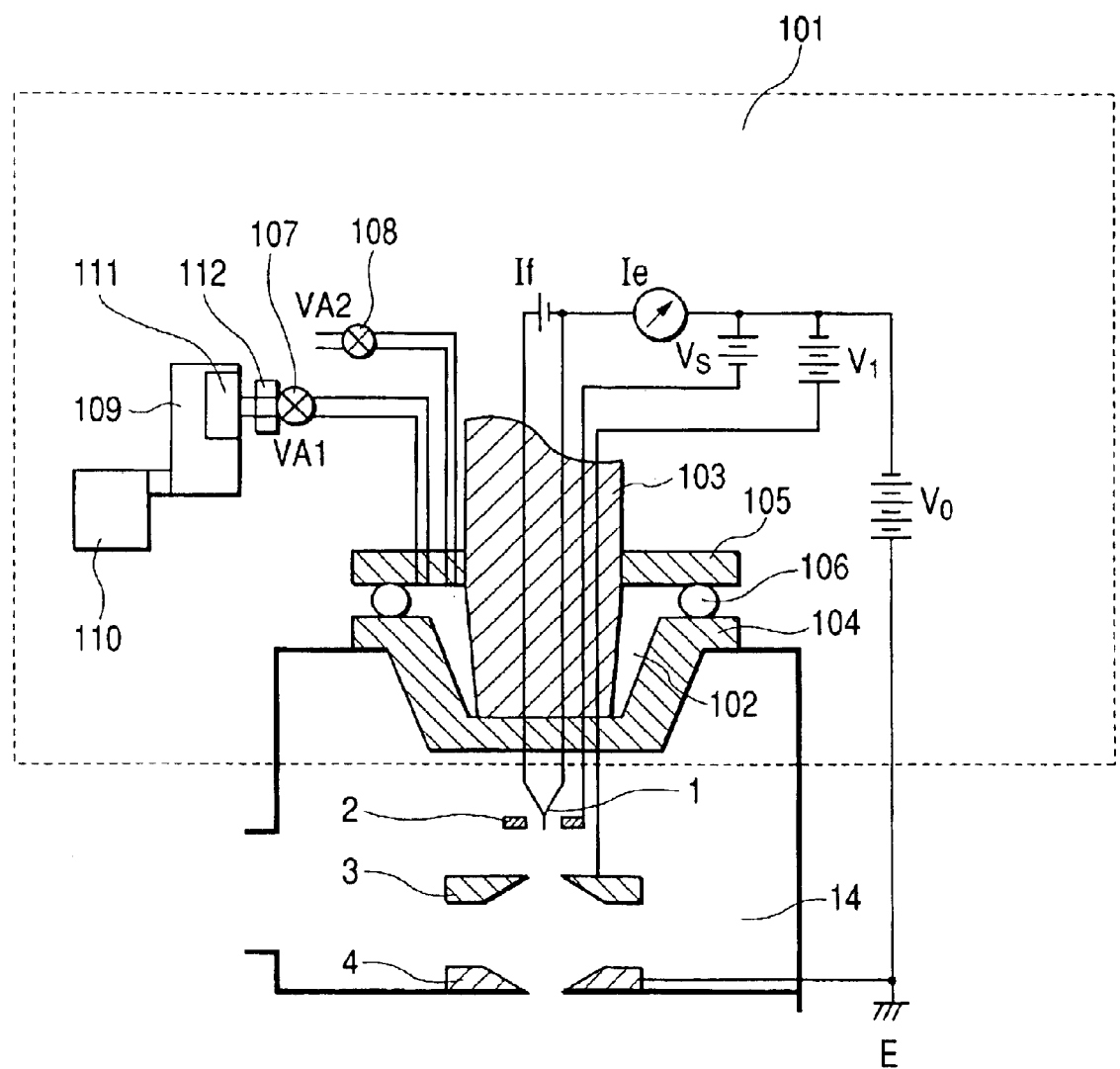
FIG. 4 is a schematic arrangement diagram showing another embodiment of the gap dehumidification means in the present invention.

FIG. 4 is the one that shows another embodiment of part relating to the dry gas device 109 shown in FIG. 2. A gas exhaust means (air compressor) 110 for chase-off of the gas at the gap portion 102 is attached to the dry gas send-out side to thereby facilitate replacement with a dry gas while providing a drying agent or desiccant 111 for enhancing the dehumidification degree of the dry gas (typically, air) along with an air filter 112 for removal of ultrafine or micro ducts in the air. Whereby, it becomes possible to perform rapid replacement of a clean dry gas with increased purity.

Figure 5:
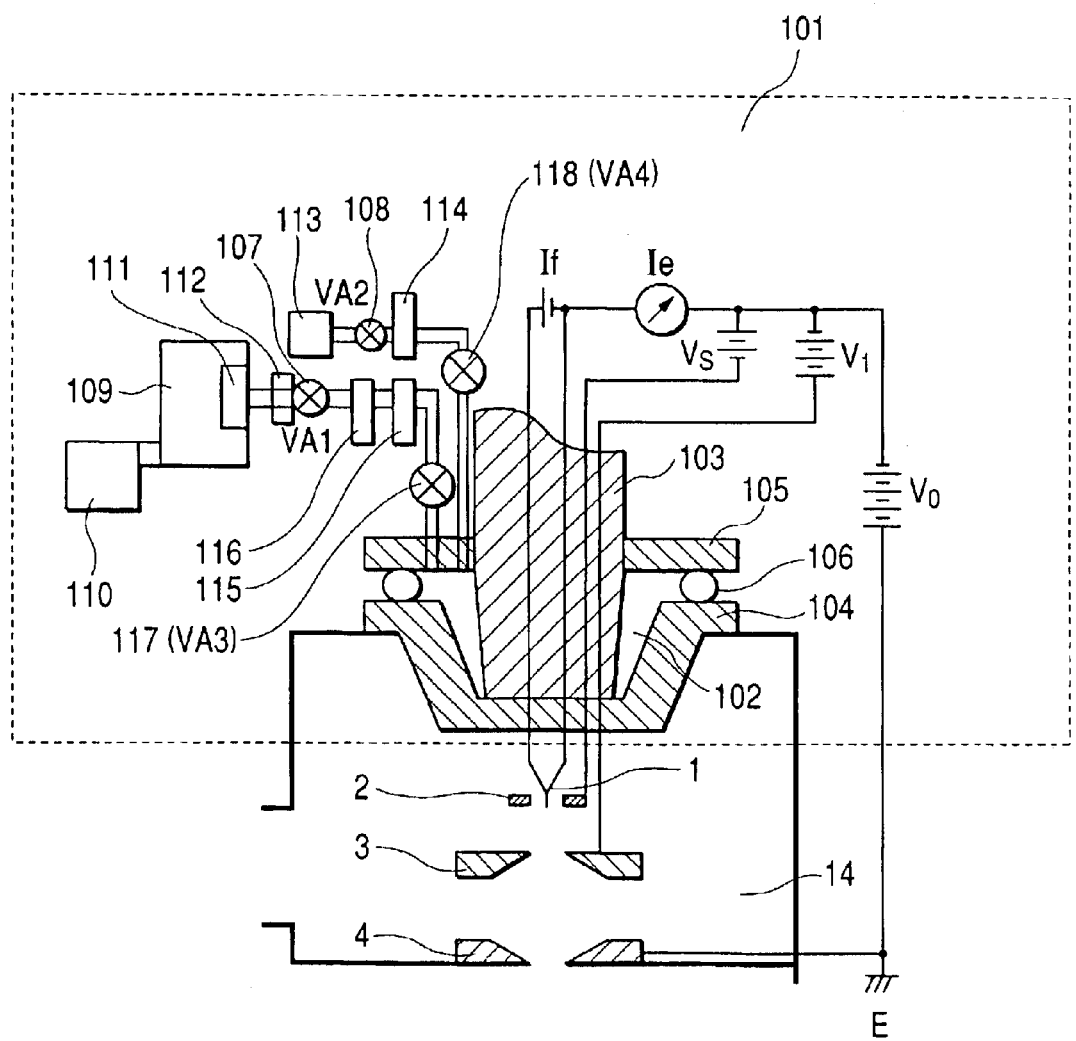
FIG. 5 is a schematic arrangement diagram showing a still another embodiment of the gap dehumidification means in the present invention.

FIG. 5 is the one that shows still another embodiment of the part relating to the dry gas device 109 shown in FIG. 2 while adding the following functions to the embodiment of FIG. 4.

More specifically, a means (mechanical vacuum pump such as an oil rotary pump or mechanical booster, or alternatively, sorption pump or else) 113 for exhausting the gas of the gap portion 102 is provided on the dry gas send-out side. Note here that in the case of an oil rotary pump, it is desired that a foreline trap be provided between it and the dry gas exhaust valve (VA2) 108 although not specifically depicted in the drawing to thereby prevent an oil vapor or steam from the oil rotary pump from backflowing toward the gap portion 102 side. Additionally in the embodiment of FIG. 5, a humidity sensor 114, a temperature sensor 115 and a pressure sensor 116 are provided at part of the flow path of such dry gas. With such an arrangement, it becomes possible to monitor the humidity, temperature and pressure of the gap portion and the flow path of the dry gas at any time. The humidity sensor 114 is more effective if the data history of the humidity of a flow path system is recorded. The temperature sensor 115 is useful for temperature management in the case of letting a dry gas higher than room temperatures flow in the flow path system to thereby achieve efficient dehumidification. Additionally the pressure sensor 116 is useful for adjustment of the pressure of the flow path system to thereby prevent it from getting higher or lower than required and also for surveillance as to the safety.

It should be noted that since there is a risk that water content is also possibly released out of said desiccant 111, air filter 112 and humidity sensor 114 and others, an open/close valve (VA3) 117 and an open/close valve (VA4) 118 may be provided at locations maximally adjacent to the gap portion 102 on the high-voltage introduction insulator side as shown in FIG. 5, wherein the former is on the entrance side of the dry gas flow path whereas the latter is on the exit side thereof.

Incidentally, after having done replacement of the gas of the gap portion 102 between the high-voltage cable and high-voltage introduction insulator in this way, again apply $V_o$ up to its maximum value—if the resultant value of Ie falls within a predetermined value, then it is found that it is due to the humidity of this gap portion, which makes it possible to perform a stable beam output operation for a long time.

Alternatively, if Ie is absent within the predetermined value then the cause does not lie in the water content on the ambient air side of the electron gun and thus another cause must be present. In such a case, it can be considered that a leakage current is produced by electric field emission due to micro projections generated between constituent members within the electron gun—for example, between the first anode 3 and the second anode 4 and/or between an electrode other than the needle shaped cathode 1 and the Earth potential member—and/or surface contamination of in-the-vacuum members such as dielectric insulators, resulting in detection of a little amount of Ie. In this case, although the probe currents $IP_1$ and $IP_2$ below the electron gun are not detected, a release gas due to Ie is present, which will appear as a change of the electron-gun chamber vacuum degree ($P_G$) as shown in d on FIG. 3 in the ion pump 15 which is the ultrahigh vacuum exhaust means of the electron gun chamber 14—that is, a change in ion current of the ion pump. Monitoring this enables verification of current leakage phenomena within the electron gun chamber. In place of the ion pump current, a vacuum degree change may be detected by attaching a vacuum meter to part of the electron gun chamber. If the Ie change and the vacuum degree change are in one-to-one correspondence, then this is the problem within the electron gun chamber; thus, self-diagnosis becomes possible, suggesting that parts-maintenance inspection and cleaning of the constituent members within the electron gun are necessary. Alternatively in case no changes are found in vacuum degree of the electron gun chamber (example of c in FIG. 3), it is considered that contamination on the surface of either the high-voltage cable or the high-voltage introduction insulator outside of the electron gun chamber must cause the leakage current; if this is the case, it is possible to judge that cleaning of these surfaces is required, which makes it possible to make a proper decision of maintenance works to be done.

The procedure as has been shown in the above embodiment is built in said self-diagnostics program 51, wherein this self-diagnostics program get started appropriately within a fixed length of time period to thereby sequentially execute detection of a change in emission current due to acceleration voltage application and detection of a change in emission current due to dry gas replacement and then issue a warning in case abnormality is found in the emission current during the process, thereby making it possible to provide the electron beam apparatus with enhanced maintenance capability and increased usability.

FIG. 6 is an implementable procedure example of the self-diagnostics program of the present invention. In FIG. 6, assume that the apparatus conditions at step S11 are such that the vacuum degree of the electron gun is normal with the state of high-voltage power supply units being set, for example, at any one of the following settings:

1. All high-voltage power supply units are OFF.
2. Only the acceleration voltage ($V_o$) is OFF whereas If, Ie, Vs and $V_1$ are ON (in other words, in an image observation standby state).
3. SEM image observation state (If, Ie, Vs, $V_1$, $V_o$ are all in the ON state).

At step S12, the keyboard 50 shown in FIG. 1 is used to allow the self-diagnostics program 51 to get started. Preferably this is built in one of menus of a maintenance screen (not shown) of the apparatus. At step S13, all of If, Ie, Vs, $V_1$, $V_o$ become OFF temporarily.

At step S14, gradually increase $V_o$ up to its maximum value (e.g. 30 to 35 kV); then, detect Ie and $P_G$; next, store them in the central control device 9. At step S15, the relation of these detected Ie and $V_o$—for example, a characteristics example such as b of FIG. 3—is displayed on the screen of CRT 29. This may alternatively be arranged so that it is displayed on a real time basis at every time point. Obviously $P_G$ (electron-gun chamber vacuum degree) may also be displayed thereon simultaneously. In addition, the values of $V_o$ and Ie, e.g. $V_o$=30 kV, Ie=0.55 $\mu$A, are displayed. At step S16, diagnosis is done to determine whether the above value is within a prespecified value or exceeds the prespecified value. This may be automated or alternatively manually executed based on an operator's judgment. If within the prespecified value, then determine the electron gun is free from the abnormality; thereafter, proceed to a normal operation such as SEM image observation. If in excess of the prespecified value then determine it is abnormal: in this case, a warning message, for example, "Leakage current is found. Check Electron Gun" is displayed on the screen (not shown); then, go to step S18. At step S18, diagnosis is done to determine the vacuum degree $P_G$ of the electron gun chamber is within a predetermined value. If it exceeds this value, then proceed to step S19 which displays on the screen a warning message of "Abnormality is found in Electron Gun." If within the value, then go to step S20 which displays on the screen a warning message of "Abnormality is found outside Electron Gun" and then go next to step S21. At step S21, prompt judgment as to "whether the dry gas flow means is installed." This may be judged by the apparatus per se or alternatively judged by the operator. If not installed, then a warning message of "Check High-Voltage Insulator and High-Voltage Cable, then Dry" is displayed on the screen at step S22. If installed, then let a dry gas flow after turn-off of the high-voltage power supply at step S23. This maybe automated or alternatively manually done by the operator. After having flown the dry gas, dried the surfaces of the high-voltage cable and high-voltage introduction insulator, and replaced a gas at the gap portion between the both with the dry gas, return to step S12 which forces the self-diagnostics program to restart. Thereafter, through similar processes, diagnosis is performed to verify whether the electron gun is in the normal state.

It must be noted that although in this embodiment the explanation was given as to the electron beam apparatus having the Schottky emission type electron gun, it is obvious that the content of the present invention should not be limited only to this and that similar effects are obtainable even when applied to electron gun apparatus having a cathode electric field emission type electron gun or thermal electric field emission type electron gun.

As has been explained above, in accordance with the present invention, it is possible to provide an electron beam apparatus and method which can retain the state that minimizes the amount of water content contained at the gap between a high-voltage cable and a high-voltage introduction insulator to thereby enable preclusion of creation of any high-voltage discharge and/or current leakage. In addition, it is possible to provide an electron beam apparatus which can rapidly and accurately perform maintenance tasks in electron beam irradiation abnormal events and thus offer enhanced usability.

What is claimed is:

1. An electron beam apparatus having an electron gun for extraction of an electron beam, comprising:
   an electron emitting tip for releasing electrons;
   an acceleration electrode for accelerating the electrons;
   a power source for supplying a voltage to the acceleration electrode; and
   a current detector for detecting an electron beam current, wherein the current detector detects a change in electron beam current as the acceleration voltage is gradually increased while a current supply to the electron emitting tip is cut.

2. The electron beam apparatus as recited in claim 1, further comprising means for issuing a warning when a change of emission current exceeds a prespecified value.

3. The electron beam apparatus as recited in claim 1, further comprising means for detecting a change in vacuum of an electron beam chamber in a way corresponding to the change of said voltage.

4. The electron beam apparatus as recited in claim 3, further comprising means for causing a dry gas to flow in a gap portion between a high-voltage introduction cable and a high-voltage introduction insulator of an electron gun to thereby dehumidify said gap portion.

5. The electron beam apparatus as recited in claim 4, wherein said dehumidifying means comprises means for extruding and exhausting a gas at said gap portion, means for causing said extruding/exhausting means to flow a dry gas for a predefined length of time period, and means for opening and closing a flow path of said dry gas.

6. The electron beam apparatus as recited in claim 4, wherein said dehumidifying means comprises means for absorbing and exhausting the gas at said gap portion, means for flowing a dry gas for a predefined length of time period after completion of absorption and exhaustion, and means for opening and closing a flow path of said dry gas.

7. The electron beam apparatus as recited in claim 6, wherein said dry gas is either dry air or a dry nitrogen gas.

8. The electron beam apparatus as recited in claim 7, wherein a seal material is provided for air-tightly sealing the gap portion between the high-voltage introduction cable and high-voltage introduction insulator of said electron gun with respect to the outside air.

9. The electron beam apparatus as recited in claim 8, wherein more than one of a humidity sensor, a temperature sensor and a pressure sensor is provided at the part of the flow path of said dry gas.

10. The electron beam apparatus as recited in claim 9, wherein a desiccant and a filter are provided at the part of the flow path of said dry gas.

11. The electron beam apparatus as recited in claim 10, further comprising a self-diagnostics program for sequentially performing detection of an emission current change due to application of an acceleration voltage and detection of an emission current change due to dry gas replacement and for issuing a warning if abnormality is found relative to the emission current in the process.

12. An electron beam apparatus leakage current discrimination method for use in the electron beam apparatus as recited in claim 11, comprising applying a high voltage to the acceleration electrode while preventing emission of any electrons from the electron source, detecting a vacuum degree change of the electron gun chamber corresponding to a change of an acceleration current at this time, and determining whether this vacuum degree change falls within a predetermined value or not to thereby judge whether a leakage current due to high-voltage application is caused by an interior of the electron gun or outside of the electron gun.

13. High-voltage discharge prevention method of an electron beam apparatus for use in an electron beam apparatus having an electron gun for take-out of an electron beam, comprising flowing a dry gas in a gap portion between a high-voltage introduction cable and a high-voltage introduction insulator of said electron gun to thereby dehumidify said gap portion and thus preventing high-voltage discharge due to moisture on a high-voltage cable surface and a high-voltage introduction insulator surface, and detecting a change in electron beam current as an acceleration voltage is gradually increased while a current supply to an electron emitter tip for releasing electrons is cut.

14. An electron beam apparatus having an electron gun for extraction of an electron beam, comprising means for causing a dry gas to flow in a gap portion between a high-voltage introduction cable and a high-voltage introduction insulator of the electron gun to thereby dehumidify said gap portion, and a current detector for detecting an electron beam current, wherein the current detector detects a change in electron beam current as an acceleration voltage is gradually increased while a current supply to an electron emitter tip is cut.

* * * * *